United States Patent
Lin

(10) Patent No.: US 8,500,949 B2
(45) Date of Patent: Aug. 6, 2013

(54) APPARATUS AND METHOD FOR WET PROCESSING SUBSTRATE

(75) Inventor: Chao-Wen Lin, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 111 days.

(21) Appl. No.: 13/161,502

(22) Filed: Jun. 16, 2011

(65) Prior Publication Data

US 2012/0067848 A1 Mar. 22, 2012

(30) Foreign Application Priority Data

Sep. 17, 2010 (CN) .......................... 2010 1 0285001

(51) Int. Cl.
*H05K 3/00* (2006.01)
*C23F 1/00* (2006.01)
*C23F 1/08* (2006.01)

(52) U.S. Cl.
USPC .................................................. 156/345.21

(58) Field of Classification Search
USPC .............................. 156/345.21, 345.2, 345.22
See application file for complete search history.

(56) References Cited

U.S. PATENT DOCUMENTS

| | | | |
|---|---|---|---|
| 2006/0163207 A1* | 7/2006 | Lee et al. ........................ | 216/92 |
| 2010/0055398 A1* | 3/2010 | Grupp Mueller et al. ..... | 428/141 |
| 2012/0067848 A1* | 3/2012 | Lin .................................. | 216/91 |

FOREIGN PATENT DOCUMENTS

TW 293651 2/2008
TW 200824518 A 6/2008

OTHER PUBLICATIONS

Pass et al. WO 2008/020974 published Feb. 21, 2008.*

* cited by examiner

*Primary Examiner* — Sylvia R MacArthur
(74) *Attorney, Agent, or Firm* — Altis Law Group, Inc.

(57) ABSTRACT

An exemplary wet processing apparatus includes a tank, a conveyor configured for conveying a substrate, and a spraying system. The tank receives a wet processing liquid. The conveyor includes a first conveying portion, a second conveying portion, and a third conveying portion. The first conveying portion is in the tank and conveys the substrate in the wet processing liquid. The second conveying portion is obliquely interconnected between the first and third conveying portions. The third conveying portion conveys the substrate above the wet processing liquid in the tank. The spraying system is above the third conveying portion, sprays the wet processing liquid onto the substrate on the third conveying portion.

20 Claims, 3 Drawing Sheets

APPARATUS AND METHOD FOR WET PROCESSING SUBSTRATE

BACKGROUND

1. Technical Field

The present disclosure generally relates to an apparatus for processing a substrate, and particularly to an apparatus and a method for wet processing a printed circuit board (PCB).

2. Description of Related Art

In the manufacture of PCBs, it is normal practice to feed the boards through a series of processing machines via a conveyor system. The process includes resist stripping, pre-cleaning, etching, neutralizing, rinsing with water, and drying. Pre-cleaning, etching, neutralizing, and rinsing with water, are known as wet processing steps. In these steps, a spray system includes at least one set of spray nozzles arranged facing the conveyor system to spray wet processing liquid on PCBs on the conveyor system. For example, the spray system can spray etchant on the PCBs to form circuits therein.

However, a swelling effect by spaying the etchant to the PCBs is not enough, and the PCBs always need to be reworked. This causes much material waste and is time consuming.

What is needed, therefore, is an apparatus and a method for wet processing a substrate which can overcome the above-described problem.

BRIEF DESCRIPTION OF THE DRAWINGS

Many aspects of the present wet processing apparatus and method can be better understood with reference to the following drawings. The components in the drawings are not necessarily drawn to scale, the emphasis instead being placed upon clearly illustrating the principles of the present wet processing apparatus and method. Moreover, in the drawings, all the views are schematic, and like reference numerals designate corresponding parts throughout the several views.

DETAILED DESCRIPTION OF THE EMBODIMENTS

Reference will now be made to the drawings to describe in detail embodiments of the wet processing apparatus and the method using the wet processing apparatus.

Figure 1:
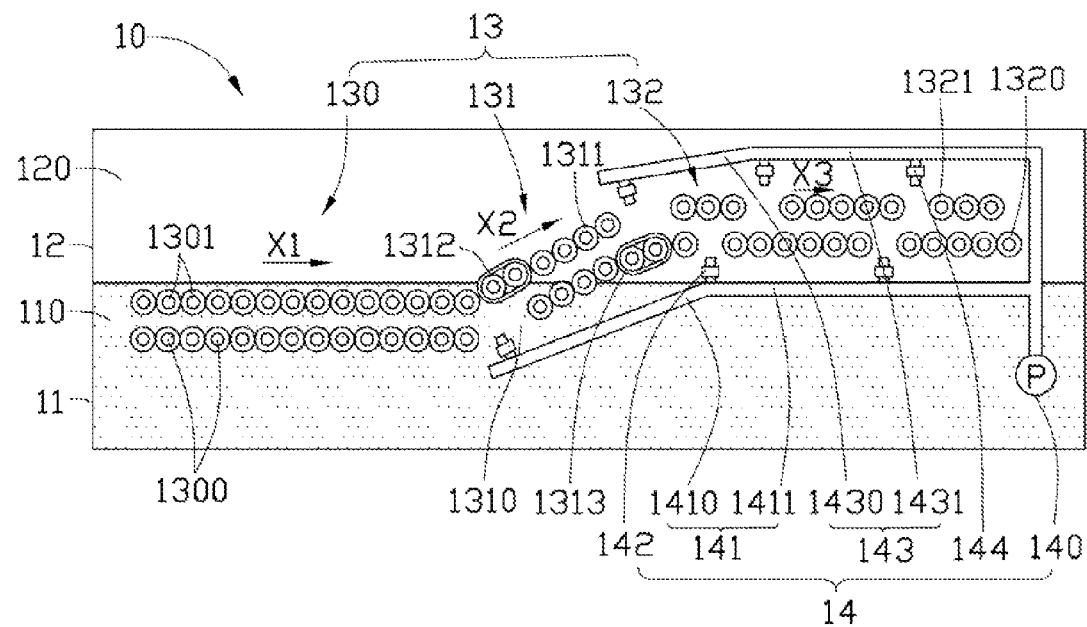
FIG. 1 is a front elevation view of a wet processing apparatus in accordance with an embodiment.

Referring to FIG. 1, a wet processing apparatus 10 for wet processing a substrate with wet processing liquid is provided in accordance with an embodiment. The apparatus 10 includes a tank 11, a cover 12, a conveyor 13, and a spraying system 14. The tank 11, the cover 12, and the spraying system 14 constitute a wet process workstation. The conveyor 13 extends through the wet process workstation. The conveyor 13 is configured for conveying substrates to pass through the wet process workstation. For example, the wet process workstation can be an etching workstation, and a substrate can be placed on the conveyor 13 and delivered through the etching workstation to form circuits thereon.

The tank 11 is configured for receiving/collecting a wet processing liquid 110, such as an etchant. The cover 12 communicates with the tank 11. The cover 12 and the tank 11 cooperatively form a chamber 120. The conveyor 13 and the spraying system 14 are accommodated in the chamber 120.

The conveyor 13 includes a first conveying portion 130, a second conveying portion 131 adjacent to the first conveying portion 130, and a third conveying portion 132 adjacent to the second conveying portion 131. Two opposite ends of the second conveying portion 131 respectively connect the first and third conveying portion 130, 132.

The first conveying portion 130 is arranged in the tank 11 and configured for conveying the substrate through the wet processing liquid 110. The first conveying portion 130 includes a number of first lower rollers 1300 and a number of first upper rollers 1301. The first lower rollers 1300 are arranged side by side along a first conveying direction X1. In the illustrated embodiment, the first conveying direction X1 is parallel to the bottom of the tank 11. The first upper rollers 1301 are also arranged along the first conveying direction X1. The first upper rollers 1301 spatially correspond to the respective first lower rollers 1300. The first upper rollers 1301 correspond to the first lower rollers 1300 one by one, and are opposite to the first lower rollers 1300. The first upper rollers 1301 can be entirely or can be partially submerged in the wet processing liquid 110. The first lower rollers 1300 are entirely submerged in the wet processing liquid 110. Thus, the substrate conveyed by the first lower and upper rollers 1300, 1301 can immerge in the wet processing liquid 110. A rotation direction of the first upper rollers 1301 is reverse to that of first lower rollers 1300. Thus, the substrate between the first lower rollers 1300 and the first upper rollers 1301 can move in the wet processing liquid 110 along the first conveying direction X1 by the rotation of the first lower and first upper rollers 1300, 1301.

The second conveying portion 131 is obliquely interconnected with the first conveying portion 130. In other words, an angle formed by a second conveying direction X2 of the second conveying portion 131 and the first conveying direction X1 of the first conveying portion 130 is an acute angle. The acute angle can be in a range from about 10 degrees to about 60 degrees. In the exemplary embodiment, the acute angle is about 30 degrees. Thus, the substrate is conveyed away from the bottom of the tank 11. The second conveying portion 131 includes a number of second lower rollers 1310, a number of second upper rollers 1311, a first guiding strap 1312, and a second guiding strap 1313. The second lower rollers 1310 are arrange side by side along the second conveying direction X2. Part of the second lower rollers 1310 are entirely submerged in the wet processing liquid 110, another part of the second lower rollers 1310 are partially submerged in the wet processing liquid 110, the remaining second lower rollers 1310 are above the wet processing liquid surface in the tank 11. The second upper rollers 1311 are also arranged side by side along the second conveying direction X2. The second upper rollers 1311 correspond to the second lower rollers 1310 one by one, and are opposite to the second lower rollers 1310. The rotation directions of the second upper rollers 1311 are reverse to those of second lower rollers 1310. Thus, a substrate placed between the second lower rollers 1310 and the second upper rollers 1311 can move out from the wet processing liquid 110 along the second conveying direction X2 by the rotation of the first lower and first upper rollers 1300, 1301. The first and second guiding straps 1312, 1313 are comprised of an elastic material. The first guiding strap 1312 is set around two or more second upper rollers 1311 adjacent to the first conveying portion 130, and is adapted for preventing the substrate conveyed from the first conveying portion 130 from moving into a clearance between the second upper rollers 1311. In the present embodiment, the first guiding strap 1312 is set around the outer surfaces of two adjacent second upper rollers 1311 adjacent to the first conveying portion 130. When the two second upper rollers 1311 rotate in a first rotation direction, the first guiding strap 1312 rotates correspondingly, thus driving the substrate to obliquely move towards the space between the second upper rollers 1311 and the second lower rollers 1310. The second guiding strap 1313 is set around two or more second lower rollers 1310 adjacent to the third conveying portion 132, and is adapted for preventing the substrate from moving into a clearance between the second lower rollers 1310. In the present embodiment, the second guiding strap 1313 is set around the outer surface of two second lower rollers 1310 adjacent to the third conveying portion 132. When the two second lower rollers 1310 rotate, the second guiding strap 1313 rotates correspondingly, thus driving the substrate to obliquely move towards the third conveying portion 132.

The third conveying portion 132 is configured for conveying the substrate above the wet processing liquid surface in the tank 11. The third conveying portion 132 includes a number of third lower rollers 1320 and a number of third upper rollers 1321. The third lower rollers 1320 are arranged side by side along a third conveying direction X3. In the illustrated embodiment, the third conveying direction X3 of the third conveying portion 132 is parallel to the first conveying direction X1 of the first conveying portion 130. The third lower rollers 1320 can be entirely or can be partially submerged in the wet processing liquid 110. The third upper rollers 1321 are arranged above the wet processing liquid 110. Thus, the substrate on the third lower and upper rollers 1320, 1321 can move above the wet processing liquid 110. The third upper rollers 1321 are also arranged along the third conveying direction X3. The third upper rollers 1321 spatially correspond to the respective third lower rollers 1320. The third upper rollers 1321 correspond to the third lower rollers 1320 one by one, and are opposite to the third lower rollers 1320. The rotation direction of the third upper rollers 1321 is reverse to those of the third lower rollers 1320. Thus, a substrate placed between the third lower rollers 1320 and the third upper rollers 1321 can move above the wet processing liquid 110 along the third conveying direction X3 by the rotation of the third lower and upper rollers 1320, 1321.

The spraying system 14 includes a pump 140, a lower pipe 141, a number of lower spraying nozzles 142, an upper pipe 143, and a number of upper spraying nozzles 144. The pump 140 is arranged in the tank 11, and is submerged in the wet process liquid 110 and configured for pumping the wet process liquid 110 to the lower and upper pipes 141, 143. The lower and upper pipes 141, 143 are in communication with the pump 140, and are configured for respectively supplying the wet processing liquid 110 to the lower and upper spraying nozzles 142, 144. The lower and upper spraying nozzles 142, 144 are adapted for spraying the wet processing liquid 110 onto the substrate on the third conveying portion 132. The lower spraying nozzles 142 are mounted on the lower pipe 141, and are opposite to the third lower rollers 1320. The upper spraying nozzles 144 are mounted on the upper pipe 143, and are opposite to the third upper rollers 1321.

The lower pipe 141 includes a first lower portion 1410 and a second lower portion 1411. The first lower portion 1410 is opposite to the second conveying portion 131, and the second lower portion 1411 is opposite to the third conveying portion 132. The lower spraying nozzles 142 are mounted on the first and second lower portions 1410, 1411. In the illustrated embodiment, one of the lower spraying nozzles 142 is mounted on the first lower portion 1410 facing an end of the second conveying portion 131 adjacent to the first conveying portion 130, while the other two lower spraying nozzles 142 are mounted on the second lower portion 1411 facing the third conveying portion 132.

The upper pipe 143 includes a first upper portion 1430 and a second upper portion 1431. The upper spraying nozzles 144 are mounted on the first and second upper portion 1430, 1431. The first upper portion 1430 is opposite to the second conveying portion 131, and the second upper portion 1431 is opposite to the third conveying portion 132. In the illustrated embodiment, one of the upper spraying nozzles 144 is mounted on the first upper portion 1430 facing an end of the second conveying portion 131 adjacent to the third conveying portion 132, while the other two upper spraying nozzles 144 are mounted on the second upper portion 1431 facing the third conveying portion 132.

The lower pipe 141 may be omitted according to need. In other words, the spraying system 14 can include just one upper pipe 143 in communication with the pump 140.

Figure 2:
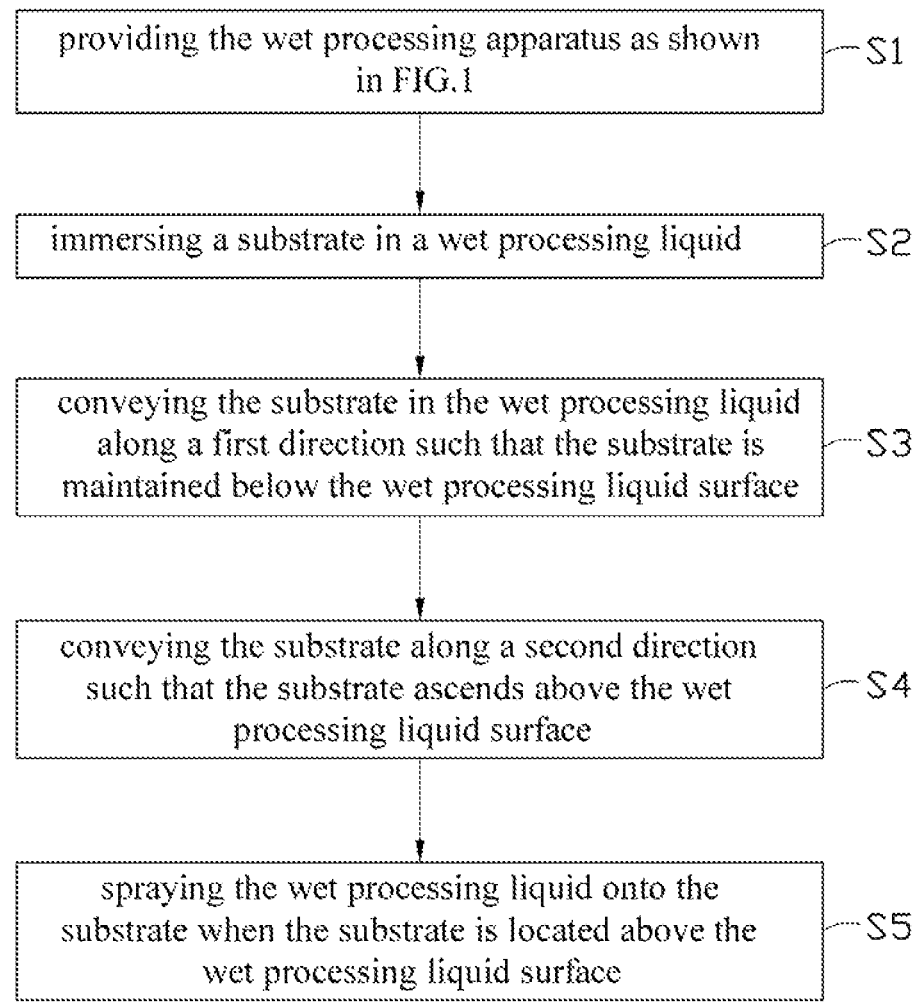
FIG. 2 is a flowchart of a wet processing method using the apparatus as shown in FIG. 1.

Referring to FIG. 2, a method for wet processing a substrate using the wet processing apparatus 10 as shown in FIG. 1 includes following steps:

S1, providing the wet processing apparatus 10 as shown in FIG. 1;

S2, immersing a substrate in a wet processing liquid;

S3, conveying the substrate in the wet processing liquid along a first direction such that the substrate is maintained below the wet processing liquid surface;

S4, conveying the substrate along a second direction such that the substrate ascends above the wet processing liquid surface; and S5, spraying the wet processing liquid onto the substrate when the substrate is located above the wet processing liquid surface.

Figure 3:
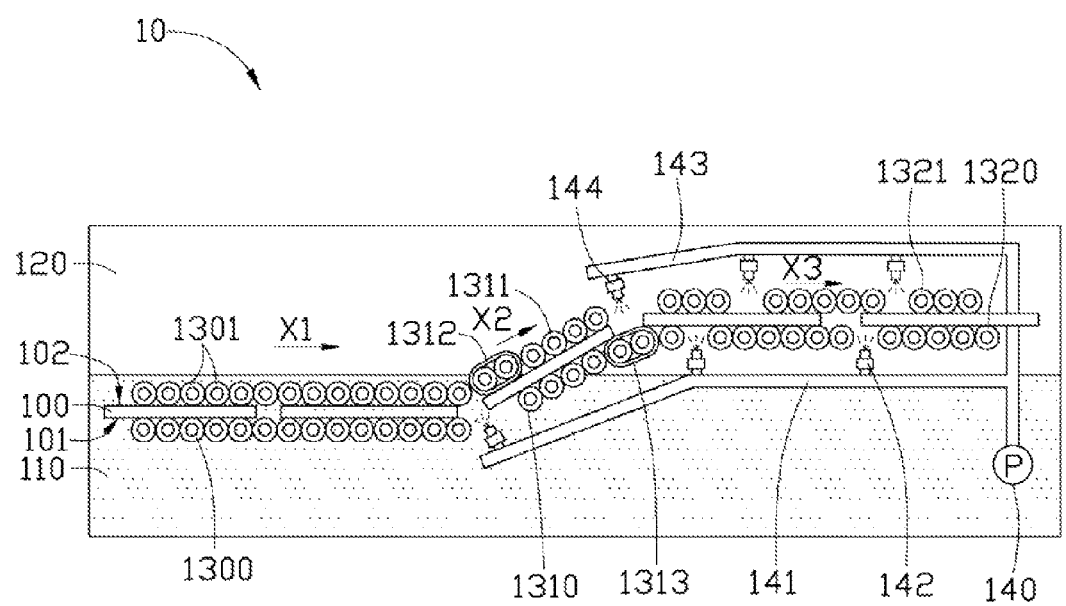
FIG. 3 is similar to FIG. 1, but showing the wet processing apparatus processing a substrate.

Referring to FIG. 3, in S1, the wet processing apparatus 10 as shown in FIG. 1 is provided.

In S2, a substrate 100 is immersed in the wet processing liquid 110. The substrate 100 having a first surface 101 and an opposite second surface 102. The substrate 100 can be a PCB covered with light resistance on two opposite sides after being exposed to UV light.

In S3, the substrate 100 is conveyed in the wet processing liquid 110 along a first direction X1 such that the substrate 100 is maintained below the wet processing liquid surface using the first conveying portion 130. The first surface 101 is in contact with the first lower rollers 1300, while the second surface 102 is in contact with the first upper rollers 1301. When the first lower and upper rollers 1300, 1301 are rotation in reverse directions, the substrate 100 is conveyed along the first conveying direction X1 and then enters into the second conveying portion 131. During the conveying process in the first conveying portion 130, because the substrate 100 is submerged in the wet processing liquid 110, all of the light resistance on the substrate 100 is swelled.

In S4, the substrate 100 is then conveyed along a second direction X2 such that the substrate 100 ascends above the wet processing liquid surface by the second conveying portion 131. When the substrate 100 enters into the second conveying portion 131, the substrate 100 is conveyed in the second conveying direction X2. The substrate 100, which cannot move into the clearance between the anterior second upper rollers 1311 because of the first guiding strap 1312, is then conveyed by the subsequent second lower and upper rollers 1310, 1311. The substrate 100 moves gradually away from the bottom of the tank 11, and makes contact with the posterior second lower and upper rollers 1310, 1311 adjacent to the third conveying portion 132. The substrate 100, which cannot move into the clearance between the posterior second lower rollers 1310 because of the second guiding strap 1313. In the present embodiment, the wet processing liquid 110 sprayed from the lower and upper spraying nozzles 142, 144 mounted on the first lower and upper portion 1410, 1430, processes the substrate 100.

In S5, the wet processing liquid 110 is sprayed onto the substrate 100 when the substrate 100 is located above the wet processing liquid surface. The substrate 100 is conveyed above the wet processing liquid 110 along the third conveying direction X3 by the third conveying portion 132. The wet processing liquid 110 is ejected out from the lower and upper spraying nozzles 142, 144 with an impact force, the sprayed wet processing liquid 110 clears the swelled light resistance on the substrate 100, thus an electrically conductive pattern is formed on two sides of the substrate 100.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

The invention claimed is:

1. A wet processing apparatus, comprising:
a tank configured for receiving a wet processing liquid;
a conveyor configured for conveying a substrate, the conveyor comprising a first conveying portion, a second conveying portion adjacent to the first conveying portion, and a third conveying portion adjacent to the second conveying portion, the first conveying portion arranged in the tank and configured for conveying the substrate in the wet processing liquid, the second conveying portion obliquely interconnected between the first and third conveying portions, the third conveying portion configured for conveying the substrate above the wet processing liquid surface in the tank; and
a spraying system arranged over the third conveying portion, the spraying system configured for spraying the wet processing liquid onto the substrate on the third conveying portion, the spraying system comprising an upper pipe and a plurality of upper spraying nozzles, the upper pipe being configured for supplying the wet processing liquid to the upper spraying nozzles, the upper spraying nozzles being mounted on the upper pipe and opposite to the third conveying portion.

2. The wet processing apparatus of claim of claim 1, wherein the spraying system further comprises a lower pipe and a plurality of lower spraying nozzles, the lower pipe is configured for supplying the wet processing liquid to the lower spraying nozzles, the lower spraying nozzles are mounted on the lower pipe and opposite to the third conveying portion.

3. The wet processing apparatus of claim 2, wherein the lower pipe includes a first lower portion and a second lower portion, the first lower portion is opposite to the second conveying portion, and the second lower portion is opposite to the third conveying portion, the lower spraying nozzles are mounted both on the first and second lower portion.

4. The wet processing apparatus of claim 3, wherein the first conveying portion includes a plurality of first lower rollers and a plurality of first upper rollers, the plurality of first lower rollers are arranged side by side along a first conveying direction, the first upper rollers spatially correspond to the first lower rollers.

5. The wet processing apparatus of claim 4, wherein the first upper rollers are fully or partially submerged in the wet processing liquid, and the first lower rollers are entirely submerged in the wet processing liquid.

6. The wet processing apparatus of claim 4, wherein the second conveying portion includes a plurality of second lower rollers and a plurality of second upper rollers, the plurality of second lower rollers are arranged side by side along a second conveying direction, the second upper rollers spatially corresponding to the second lower rollers.

7. The wet processing apparatus of claim 6, wherein an angle between a second conveying direction of the second conveying portion and the first conveying direction of the first conveying portion is an acute angle.

8. The wet processing apparatus of claim 7, wherein the acute angle is in a range from 10 degrees to 60 degrees.

9. The wet processing apparatus of claim 6, wherein a portion of the second lower rollers are entirely submerged in the wet processing liquid, another portion of the second lower rollers are partially submerged in the wet processing liquid, the remaining second lower rollers are above the wet processing liquid surface.

10. A wet processing apparatus, comprising:
a tank configured for receiving a wet processing liquid;
a conveyor configured for conveying a substrate, the conveyor comprising a first conveying portion, a second conveying portion adjacent to the first conveying portion, and a third conveying portion adjacent to the second conveying portion, the first conveying portion arranged in the tank and configured for conveying the substrate in the wet processing liquid along a first conveying direction, the second conveying portion obliquely interconnected between the first and third conveying portions, the second conveying portion comprising a plurality of second lower rollers and a plurality of second upper rollers, the plurality of second lower rollers being arranged side by side along a second conveying direction, the second upper rollers spatially corresponding to the second lower rollers, the third conveying portion configured for conveying the substrate above the wet processing liquid surface in the tank; and
a spraying system arranged over the third conveying portion, the spraying system configured for spraying the wet processing liquid onto the substrate on the third conveying portion, wherein the second conveying portion further includes a first guiding strap and a second guiding strap, the first and second guiding straps are comprised of an elastic material, the first guiding strap is set on some of the second upper rollers adjacent to the first conveying portion, and is adapted for preventing the substrate conveyed from the first conveying portion moving into a clearance between the second upper rollers, the second guiding strap is set on some of the second lower rollers adjacent to the third conveying portion, and is adapted for preventing the substrate conveyed from the first conveying portion moving into a clearance between the second lower rollers.

11. The wet processing apparatus of claim 10, wherein the third conveying portion includes a plurality of third lower rollers, the third lower rollers are arranged side by side along a third conveying direction, the spraying system includes a lower pipe and a plurality of lower spraying nozzles, the lower pipe is configured for supplying the wet processing liquid to the lower spraying nozzles, the lower spraying nozzles are mounted on the lower pipe and opposite to the third lower rollers.

12. The wet processing apparatus of claim 11, wherein the lower pipe includes a first lower portion and a second lower portion, the first lower portion is opposite to the second conveying portion, and the second lower portion is opposite to the third conveying portion, the lower spraying nozzles are mounted both on the first and second lower portion.

13. The wet processing apparatus of claim 12, wherein the third conveying portion further includes a plurality of third upper rollers, and the third upper rollers spatially correspond to the respective third lower rollers.

14. The wet processing apparatus of claim 13, wherein the third lower rollers are entirely or partially submerged in the wet processing liquid, and the third upper rollers are above the wet processing liquid.

15. The wet processing apparatus of claim 13, wherein the spraying system further includes an upper pipe and a plurality of upper spraying nozzles, the upper pipe is configured for supplying the wet processing liquid to the upper spraying nozzles, the upper spraying nozzles are mounted on the upper pipe and opposite to the plurality of third upper rollers.

16. The wet processing apparatus of claim 15, wherein the upper pipe includes a first upper portion and a second upper portion, the first upper portion is opposite to the second conveying portion, and the second upper portion is opposite to the third conveying portion, the upper spraying nozzles are mounted both on the first and second upper portion.

17. A wet processing apparatus, comprising:
a tank configured for receiving a wet processing liquid;
a conveyor configured for conveying a substrate, the conveyor comprising a first conveying portion, a second conveying portion adjacent to the first conveying portion, and a third conveying portion adjacent to the second conveying portion, the first conveying portion arranged in the tank and configured for conveying the substrate in the wet processing liquid, the second conveying portion obliquely interconnected between the first and third conveying portions, the third conveying portion configured for conveying the substrate above the wet processing liquid surface in the tank; and
a spraying system arranged over the third conveying portion, the spraying system configured for spraying the wet processing liquid onto the substrate on the third conveying portion, the spraying system comprising a lower pipe and a plurality of lower spraying nozzles, the lower pipe being configured for supplying the wet processing liquid to the lower spraying nozzles, the lower spraying nozzles being mounted on the lower pipe, wherein the lower pipe includes a first lower portion and a second lower portion, the first lower portion is opposite to the second conveying portion, and the second lower portion is opposite to the third conveying portion, the lower spraying nozzles are mounted both on the first and second lower portion.

18. The wet processing apparatus of claim of claim 17, the spraying system further includes an upper pipe and a plurality of upper spraying nozzles, the upper pipe is configured for supplying the wet processing liquid to the upper spraying nozzles, the upper spraying nozzles are mounted on the upper pipe and opposite to the third conveying portion.

19. The wet processing apparatus of claim 18, wherein the upper pipe includes a first upper portion and a second upper portion, the first upper portion is opposite to the second conveying portion, and the second upper portion is opposite to the third conveying portion, the upper spraying nozzles are mounted both on the first and second upper portion.

20. The wet processing apparatus of claim 19, wherein the second conveying portion comprises a plurality of second lower rollers and a plurality of second upper rollers, the plurality of second lower rollers being arranged side by side along a second conveying direction, the second upper rollers spatially corresponding to the second lower rollers, the second conveying portion further includes a first guiding strap and a second guiding strap, the first and second guiding straps are comprised of an elastic material, the first guiding strap is set on some of the second upper rollers adjacent to the first conveying portion, and is adapted for preventing the substrate conveyed from the first conveying portion moving into a clearance between the second upper rollers, the second guiding strap is set on some of the second lower rollers adjacent to the third conveying portion, and is adapted for preventing the substrate conveyed from the first conveying portion moving into a clearance between the second lower rollers.

\* \* \* \* \*